United States Patent [19]

Weglein

[11] 4,048,594
[45] Sept. 13, 1977

[54] SURFACE ACOUSTIC WAVE FILTER

[75] Inventor: Rolf D. Weglein, Los Angeles, Calif.

[73] Assignee: Hughes Aircraft Company, Culver City, Calif.

[21] Appl. No.: 646,093

[22] Filed: Jan. 2, 1976

[51] Int. Cl.² .................. H03H 9/26; H03H 9/04; H01L 41/10
[52] U.S. Cl. ..................... 333/72; 310/313; 333/30 R
[58] Field of Search ............... 333/30 R, 72; 310/8-8.3, 9.8; 331/107 A

[56] References Cited

U.S. PATENT DOCUMENTS

| | | |
|---|---|---|
| 3,568,102 | 3/1971 | Tseng .................. 333/72 X |
| 3,753,164 | 8/1973 | De Vries ............... 333/72 X |
| 3,781,717 | 12/1973 | Kuenemund ............. 333/72 X |
| 3,886,504 | 5/1975 | Hartmann et al. ........... 333/72 |

Primary Examiner—Archie R. Borchelt
Assistant Examiner—Marvin Nussbaum
Attorney, Agent, or Firm—John Holtrichter, Jr.; W. H. MacAllister

[57] ABSTRACT

A surface acoustic wave device useful as a notch filter or a narrow-band transmission filter, the device including a periodic metallic grating disposed on a suitable surface acoustic wave supporting substrate in a beam path defined by an input transducer, the grating elements each exhibiting energy storage discontinuities at the extremities thereof.

1 Claim, 5 Drawing Figures

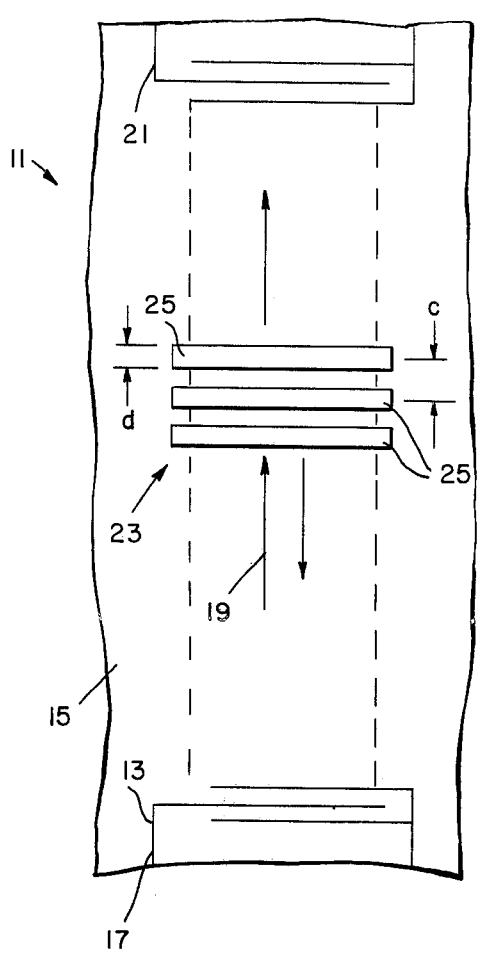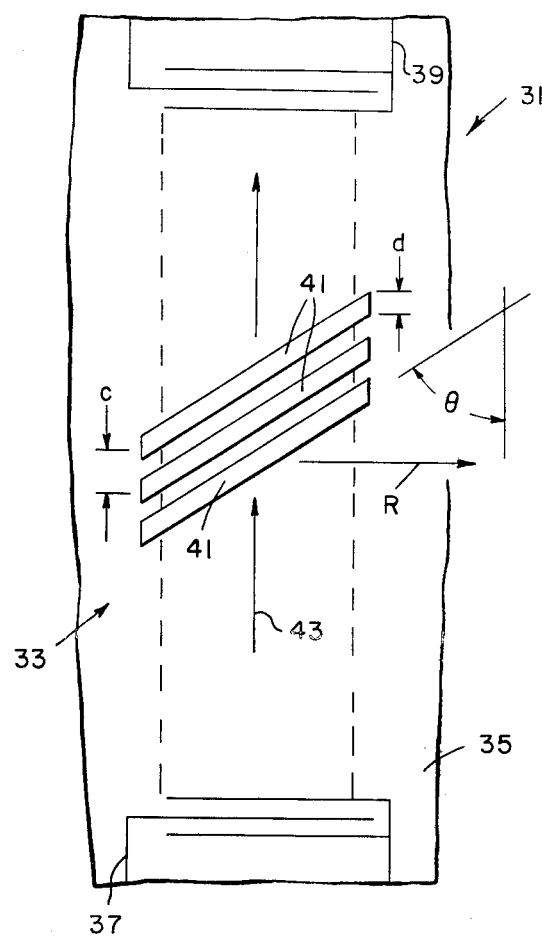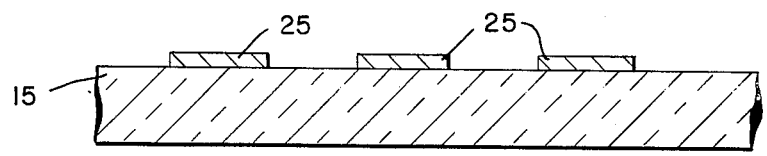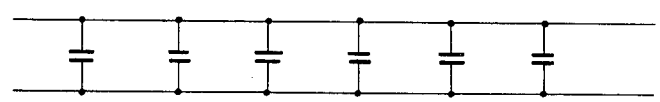

SURFACE ACOUSTIC WAVE FILTER

BACKGROUND OF THE INVENTION

The background of the invention will be set forth in two parts.

1. Field of the Invention

The invention relates to surface acoustic wave devices and more particularly to surface acoustic wave filters.

2. Description of the Prior Art

Conventional LC circuits used as band pass and rejection type filters operating in the Very High Frequency (VHF) region have generally demonstrated characteristics, because of their relatively low Q, which leave something to be desired. One technique that has been developing over the years is the use of active filters. Although providing some advantageous results, this scheme requires a substantial number of components and has some stability problems.

Another technique has been to construct surface acoustic wave (SAW) filters of the type described in an article by R. H. Tancrell and M. G. Holland, entitled "Acoustic Surface Wave Filters" in Proceedings of the IEEE, Vol. 59, page 393, 1971. In this area, the filter function is achieved at the cost of requiring one or more additional components having the same order of complexity as the surface acoustic wave transducers, as taught in an article entitled "Filters and Dispersive Delay Lines Using Repetitively-Mismatched Ultrasonic Transmission Lines" in IEEE Transactions, Sonics and Ultrasonics, Vol. SU-15, pages 111–119 (April 1968). Another SAW filter design requires external tuning elements, as suggested in an article in Electronic Letters, Vol. 10, pages 218–219 (30 May 1974) by G. Craven, entitled "Surface-Acoustic-Wave Rejection Filters Using Mode Conversion/Reconversion."

SUMMARY OF THE INVENTION

In view of the foregoing factors and conditions characteristic of the prior art, it is a primary object of the present invention to provide an improved surface acoustic wave filter.

Another object of the present invention is to provide a narrow band surface acoustic wave filter by scattering from a large periodicity grating.

Still another object of the present invention is to provie a unique surface acoustic wave filter incorporating a periodic grating structure of spaced conductive elements which produce reflections acting in either a desired reactive or absorbtive mode.

Yet another object of the present invention is to provide a surface acoustic wave filter having a narrow band, intense reflection that may be used either as a notch filter or as a narrow band transmission filter.

Yet a further object of the present invention is to provie a surface acoustic wave filter incorporating a metallic film grating with substantially reduced lithography requirements compared to that needed for the transducer geometry at the same frequency and bandwidth.

In accordance with one embodiment of the present invention, a surface acoustic wave filter includes input means including an input transducer disposed on a substrate of material capable of supporting propagating surface acoustic wave energy, the transducer converting electromagnetic energy to surface acoustic wave energy in the substrate and for causing the surface acoustic wave energy to propagate along a first path. Output means including an output transducer is disposed on the substrate for converting surface acoustic wave energy incident thereon to output electromagnetic energy. Also, the invention includes periodic metallic grating means disposed on the substrate in the above-mentioned path for reflecting a predetermined fraction of surface wave energy from the input transducer in a predetermined relatively narrow frequency band, the grating means including a plurality of spaced parallel metal elements each exhibiting energy storage discontinuities at the extremities thereof.

The reflective grating array may have elements disposed essentially orthogonal to the path direction of propagating surface acoustic wave energy that is incident thereon, or the elements may be at a predetermined angle to such path direction for operation, respectively, as a reflective notch, or an absorption notch, for example.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings, in which like reference characters refer to like elements in the several views.

BRIEF DESCRIPTION OF THE DRAWINGS

FIG. 1 is a schematic plan view of a surface acoustic wave filter of a reflective notch type in accordance with one embodiment of the present invention;

FIG. 2 is a schematic illustration of a transmission line with the capacitive discontinuities characteristic utilized in the various embodiments of the present invention;

FIG. 3 is a schematic plan view of a surface acoustic wave filter of an absorptive notch type constructed in accordance with another embodiment of the present invention;

Figure 4:
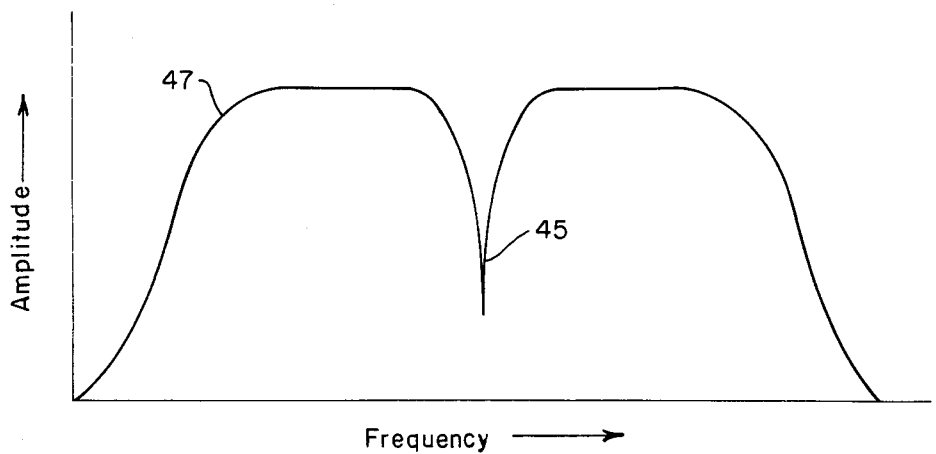
FIG. 4 is a graph illustrating a typical notch characteristic produced by notch embodiments of the present invention.

DESCRIPTION OF THE PREFERRED EMBODIMENTS:

A surface acoustic wave filter in accordance with a reflective notch embodiment 11 of the present invention is shown in FIG. 1. Here a relatively broad band input interdigital transducer 13 is disposed on a substrate 15 of a material, such as $LiNbO_3$, for example, that is capable of supporting surface acoustic wave energy. The input transducer converts electromagnetic wave energy coupled to its input terminals 17 to surface acoustic wave energy propagating along a path indicated by arrow 19 toward a relatively broad band output interdigital transducer 21 also disposed on the substrate 15. A periodic metallic grating array 23 is disposed in and covers the entire beam path width and has a predetermined periodicity to reflect a controlled fraction, or possibly even all, of the power incident thereon in a narrow frequency band.

The narrow-band reflection is produced by the periodic metallic film grating of N individual reflective grating elements 25 having substantially reduced lithography requirements, as compared with that needed for the transducer geometry at the same frequency and bandwidth. The reduced lithography comes about through the utilization of energy storage discontinues (ESD) that exist at the extremities (in the path direction) of the metal elements 25, when placed on a strongly piezoelectric substrate and along a direction of large electromagnetic coupling constant $k^2$, such as in the case of Z-propagating y-cut $LiNbO_3$, for example.

FIG. 2 shows the ESD elements as localized capacitances at the metal film extremities. Since there are two such capacitances per metal strip 25, and the resulting localized impedance discontinuity is large, efficient reflection results from these 2 N ESD elements, with reduced lithography. In the past, the discontinuities produced by these elements have not been recognized as being large and effective and, existing theories that deal with similar structures do not consider them and, in fact, no coherent reflection is therefore predicted (see for example the Apr. 1968 Sonics and Ultrasonics article previously cited).

In embodiment 11 illustrated in FIG. 1, the dimension c is approximately equal to the wavelength of the propagating energy, while the d dimension is approximately one-half wavelength wide. Generally, for best reflection, $d = c/2$. As to the number of grating elements 25 in the array 23, the notch depth will increase with the number of elements 25 up to the number where multiple reflections occur and the notch widens. Information of this subject may be obtained by referring to a reference such as an article entitled "Multiple Reflections in Acoustic Surface Wave Reflection Arrays" by Oberdan Otto in IEEE Transactions on Soncis and Ultrasonics, page 251, July 1975.

In a device constructed in accordance with the embodiment of FIG. 1, the dimensions and results of its operation are given as follows:

No. of stripes 40
frequency (MHz) 102
wavelength ($\mu$m) 34.1
stripe pitch c ($\mu$m) 35
notch depth (dB) 4.46
type reflection reactive.

As to embodiment 31 of FIG. 3, here an adsorptive type reflection characteristic is utilized. A periodic metallic grating array 33 is disposed on a SAW propagation supporting substrate 35 between a conventional relatively broad band input and output interdigital transducers 37 and 39, respectively. The grating elements 41 of the array 33 are at an angle $\theta$ with respect to the direction of incident I-propagation (arrow 43) and causes a reflection of energy R such that $\tan\theta = v_R/v_I$, where $v_R$ is the velocity along the reflected direction and $v_I$ is the velocity along the incident direction. The d dimension should be approximately 1 wavelength, and the dimension c is approximately two wavelengths in length. The number of grating elements may be determined as in the first embodiment and the dimensions and results of test data on a device constructed as shown in FIG. 3 are as follows:

No. of stripes 113
frequency (MHz) 401
wavelength ($\mu$m) 8.71
stripe pitch c ($\mu$m) 21.5
notch depth (dB) 35
type reflection adsorptive.

It can be seen that in this embodiment, the dimensions of the reflective pattern (pitch = 21.5 $\mu$m) can be large compared to the prevailing wavelength (8.71 $\mu$m) at the frequency in question. In the latter case, the interaction is large, not only because of the large number of stripes but also because of the scattering of the incoming (z-directed) Rayleigh wave into a pseudo-surface wave (x-directed) that exhibits a large coupling constant ($k^2 \simeq 0.1$). The notch 45 provided in the pass band response 47 for the embodiment 31 is shown in FIG. 4.

Figure 5:
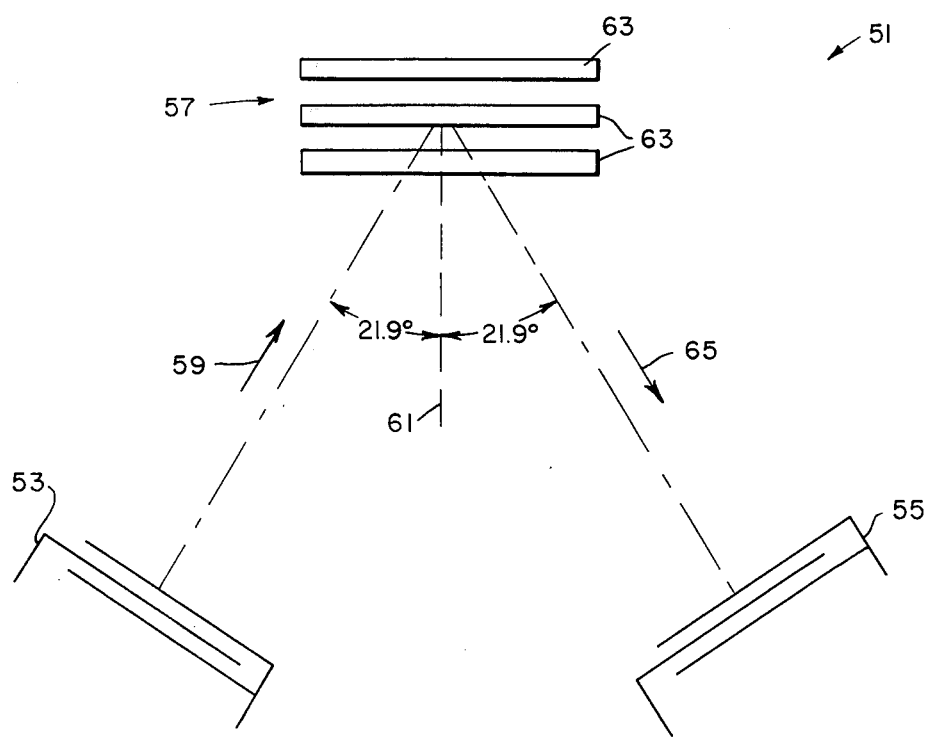
FIG. 5 is a schematic plan view of a narrow band transmitting filter embodiment of the present invention.

Referring now to FIG. 5, there is schematically shown a narrow band transmitting filter 51 having input and output transducers 53 and 55 disposed along with a periodic metallic grating array 57 on a substrate (not shown) which is similar to the substrates illustrated for the previously described embodiments.

The input transducer 53 is oriented to produce a beam direction 59 at an angle $\theta_1$ ($\approx 21.9°$) with respect to a line 61 lying perpendicular to the length dimension of grating elements 63 of the array 57, while the reflected beam direction 65 toward the output transducer 55 is also at an angle $\theta_1$.

From the foregoing it can be seen that the invention provides a novel and advantageous implementation of narrow-band notch filters in surface acoustic waves by coherently scattering from large periodicity metallic grating arrays. It has been shown that utilizing the principles of the present invention, it is a simple task to add to an existing delay line or design a new delay line having a desired filter function. Thus, the invention has advanced the state of the art which uses periodicity which is of the same order of complexity as SAW transducers and/or requires external tuning elements as exemplified in an article entitled "Surface-Acoustic-Wave Rejection Filters Using Mode Conversion/Reconversion" by G. Craven, in Electronic Letters, Vol. 10, pages 218-219 (30 May 1974).

It should be understood that the materials used to fabricate the various embodiments of the invention are not critical and any material exhibiting similar desired characteristics may be used.

Although the present invention has been shown and described with reference to particular embodiments, nevertheless, various changes and modifications and other embodiments which are obvious to persons skilled in the art to which the invention pertains are deemed to lie within the spirit, scope and contemplation of the invention.

What is claimed is:

1. A surface acoustic wave filter comprising:
a substrate of material capable of supporting propagating surface acoustic wave energy;
input means including an input transducer disposed on said substrate for converting electromagnetic energy to surface acoustic wave energy in said substrate and for causing said surface wave energy to propagate along a first path;
output means including an output transducer disposed on said substrate for converting surface acoustic wave energy incident thereon to output electromagnetic energy; and
periodic metallic grating means disposed on said substrate in said first path for reflecting a predetermined fraction of surface wave energy from said input transducer in a predetermined relatively narrow frequency band, said grating means including a plurality of parallel metallic elements spaced at least one wavelength apart, said metallic elements being perpendicular to the direction of said first path the reflected energy propagating back toward said input transducer in a reactive mode of operation.

* * * * *